United States Patent [19]

Sloan et al.

[11] Patent Number: 5,250,841
[45] Date of Patent: Oct. 5, 1993

[54] SEMICONDUCTOR DEVICE WITH TEST-ONLY LEADS

[75] Inventors: James W. Sloan, Austin; Timothy J. Mennitt, Cedar Park; John P. Warren, Austin, all of Tex.

[73] Assignee: Motorola, Inc., Schaumburg, Ill.

[21] Appl. No.: 7,036

[22] Filed: Jan. 21, 1993

Related U.S. Application Data

[63] Continuation of Ser. No. 864,255, Apr. 6, 1992, abandoned.

[51] Int. Cl.$^5$ .................. H01L 23/48; H01L 23/50
[52] U.S. Cl. .................................. 257/666; 257/693; 257/48
[58] Field of Search ............ 357/70, 80, 74, 72; 257/666, 667, 668, 669, 670, 671, 672, 673, 674, 675, 676, 692, 693, 694, 695, 696, 698, 48

[56] References Cited

U.S. PATENT DOCUMENTS

| | | | |
|---|---|---|---|
| 3,611,061 | 10/1971 | Sergerson | 357/70 |
| 4,874,086 | 10/1989 | Imamura et al. | 357/70 |
| 5,036,380 | 7/1991 | Chase | 357/70 |

FOREIGN PATENT DOCUMENTS 57-192058  11/1982  Japan ................. 357/70

*Primary Examiner*—Rolf Hille
*Assistant Examiner*—S. V. Clark
*Attorney, Agent, or Firm*—Patricia S. Goddard

[57] ABSTRACT

A semiconductor device (10) includes test-only leads (20) and operational leads (18). Operational leads (18) provide access to portions of a semiconductor die (12) needed for device operation. Test-only leads (20) provide access to portions of die (12) which are not needed for device operation, but which are needed during manufacturing tests. Operational leads (18) have an external configuration which facilitates attachment to a user substrate. Test-only leads (20) have an external configuration which enables electrical access to the device for test purposes; however, the test-only lead configuration makes attachment to the user substrate difficult. Since the test-only leads (20) and the operational leads (18) have two different external lead configurations, overall lead pitch is reduced, enabling device (10) to be made very small. Yet, complexity of mounting device (10) to a user substrate is not increased since the pitch between adjacent operational leads (18) can be made larger than the overall lead pitch.

17 Claims, 2 Drawing Sheets

SEMICONDUCTOR DEVICE WITH TEST-ONLY LEADS

This application is a continuation of prior application Ser. No. 07/864,255, filed Apr. 6, 1992, abandoned Mar. 19, 1993.

CROSS-REFERENCE TO A RELATED APPLICATION

The present application relates to a commonly assigned, co-pending application by Timothy J. Mennitt et al. entitled, "Semiconductor Device With Test-Only Contacts and Method for Making the Same,", Ser. No. 07/864,246 filed Apr. 6, 1992.

FIELD OF THE INVENTION

The present invention is related to semiconductor devices in general, and more specifically to semiconductor devices having test-only contacts and methods for making the same.

BACKGROUND OF THE INVENTION

Semiconductor manufacturers are continually driven to make semiconductor devices smaller, particularly in regard to consumer electronics applications. A problem for many manufacturers in achieving smaller devices is the need to extensively test devices prior to shipment to customers. Upon completion of device fabrication, manufacturers conduct electrical tests on the device to ensure that each circuit of the device is functioning properly. In order to accomplish this testing, each circuit must be electrically accessible. Electrical access to the circuits is achieved through external contacts which are electrically coupled to bond pads of a semiconductor die. The external contacts may take one of several forms, such as conductive pins, solder balls, or leads. In many instances, some of the external contacts and bond pads that are necessary to test the device are not required during device operation. Due to the presence of the contacts and bond pads that are used only for testing purposes and not in an operational mode, semiconductor devices can be much larger than is actually required for device operation.

SUMMARY OF THE INVENTION

Many of the disadvantages of the prior art mentioned above are overcome by the present invention. In one form, a semiconductor device has a semiconductor die with an integrated circuit formed thereon. A first plurality of bond pads of the die are electrically coupled to operational portions of the integrated circuit, while a second plurality of bond pads of the die are electrically coupled to test portions of the integrated circuit. A first plurality of conductive leads is electrically coupled to the first plurality of bond pads. Each lead of the first plurality of leads is configured for connection to a user substrate. A second plurality of conductive leads is electrically coupled to the second plurality of bond pads. Each lead of the second plurality of leads is configured for device testing and such that connection to the user substrate is impeded.

These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

The present invention addresses a problem associated with keeping a semiconductor device size small while at the same time having full electrical accessibility to the device. As mentioned above, electrical access to a device is provided by external contacts, for example leads. While an extensive number of external contacts provides full accessibility to the device, many of these external contacts may not be needed during device operation. The external contacts that are not needed during device operation are usually used by the device manufacturer for testing purposes. In conventional semiconductor devices, the external contacts that are needed during device operation and the external contacts that are used for device testing have the same configuration. As an example, a semiconductor device, such as a plastic leaded chip carrier (PLCC), may have forty-four leads, but only thirty-two of the leads are needed for device operation. The remaining twelve leads are used only for testing purposes, and are thus termed test-only leads. As a result of having the twelve test-only leads configured the same as the thirty-two operational leads, the semiconductor device is larger than is required for device operation.

In accordance with the present invention, a semiconductor device has two sets of leads, a first set for operational purposes and a second set for testing purposes. The two sets of leads are configured differently so that the size of the semiconductor device is reduced in comparison to a device having all leads of the same configuration. In one embodiment of the present invention, the set of operational leads is configured into a standard lead configuration, such as a J-lead, gull-wing, through-hole, butt-joint configuration, or the like. The standard configurations are designed for subsequent connection of the leads to a user substrate, for instance a printed circuit board. The set of test-only leads are configured into test contacts, which are not connected to a user substrate, but which can be electrically contacted to access test portions of the device.

Figure 1:
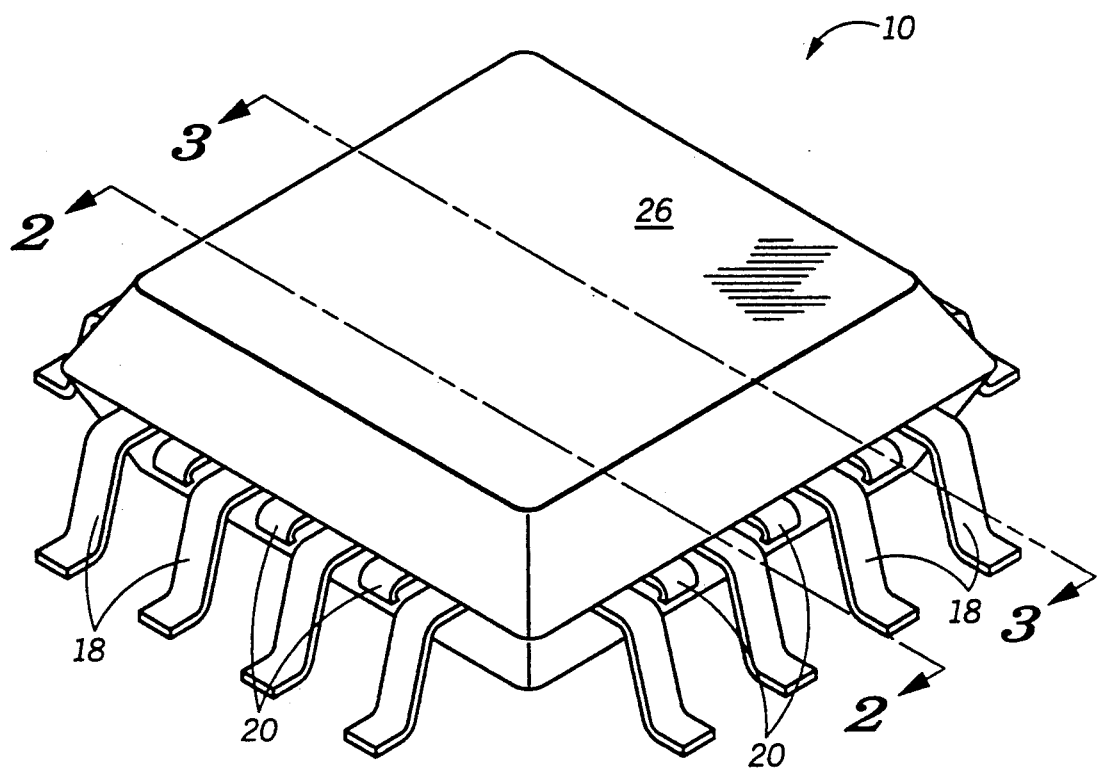
FIG. 1 is a perspective view of a semiconductor device in accordance with the present invention.
Figure 2:
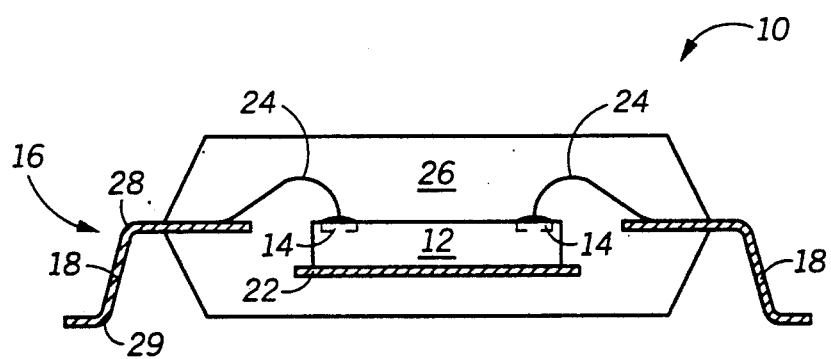
FIG. 2 is a cross-sectional view of the semiconductor device of FIG. 1 taken along the line 2—2.
Figure 3:
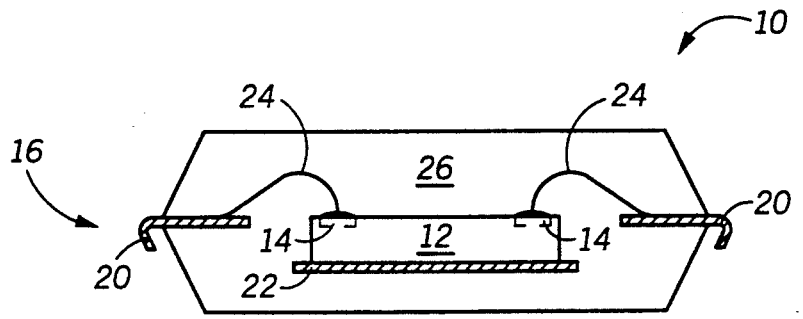
FIG. 3 is a cross-sectional view of the semiconductor device of FIG. 1 taken along the line 3—3.

Illustrated in FIG. 1 is a perspective view of a semiconductor device 10 in accordance with the present invention. FIG. 2 and FIG. 3 are cross-sectional illustrations of device 10 taken along the lines 2—2 and 3—3, respectively. The following description of device 10 may refer to elements that are not illustrated in each of FIGS. 1-3; therefore, it is helpful to refer to all three figures simultaneously in order to understand the various features of the invention.

Device 10 includes a semiconductor die 12 having an integrated circuit formed thereon. The nature of the integrated circuit is not important in understanding the present invention; therefore, the integrated circuit is not illustrated. Die 12 may include any type of integrated circuit, including but not limited to a microprocessor, a memory array, a gate array, an analog device, and the like. Formed on a surface of die 12 is a plurality of bond pads 14. Bond pads 14 are electrically coupled to the integrated circuit in a conventional manner. Typically, bond pads 14 are metal pads which are electrically routed by various conductive layers in the die to an appropriate portion of the integrated circuit.

Also included in device 10 are portions of a leadframe 16. An entire leadframe is not illustrated in FIGS. 1-3, rather only those portions of the leadframe that are specifically included in device 10 are depicted. The portions of leadframe 16 included in device 10 are a plurality of operational leads 18, a plurality of test-only leads 20, and a die receiving area 22, each of which will be described in more detail below. Leadframe 16, including all leads and the die receiving area, are often formed of a stamped or etched metal. Common metals used to form semiconductor leadframes include copper, copper alloys, iron-nickel alloys, and the like. Portions of the leads and die receiving area may also be plated with, for example, silver. Die receiving area 22 is used to support semiconductor die 12. A common method of securing die 12 to the die receiving area of the leadframe is by using a conductive epoxy material (not illustrated). As an alternative to using a metallic leadframe, other types of leadframes may instead be used in accordance with the present invention. For example, tape-automated-bonding (TAB) leadframes, flexible circuits, and the like are also suitable.

Operational leads 18 and test-only leads 20 are electrically coupled to bond pads 14 of semiconductor die 12. Each bond pad 14 of die 12 is electrically coupled to an inner portion of one of the leads by a conductive wire 24, such as a gold or an aluminum wire. The inner portions of operational leads 18 are electrically coupled to those bond pads which provide electrical access to portions of the integrated circuit required for device operation. Outer portions of operational leads 18 are shaped or configured into a conventional lead configuration outside a package body 26. External lead configurations common to the semiconductor industry include J-lead, gull-wing, through-hole, and butt-joint configurations. As illustrated in FIGS. 1-2, operational leads 18 have a gull-wing configuration. The configuration of operational leads 18 is one that will permit subsequent connection to a user substrate (not illustrated). In most cases, operational leads will extend below a bottom surface of package body 26 in order for the device to be mounted to the user substrate.

Inner portions of test-only leads 20 are electrically coupled to those bond pads which provide electrical access to test portions of the integrated circuit. Outer portions of test-only leads 20 extend outside package body 26, but are configured differently than operational leads 18. In a preferred embodiment of the present invention, test-only leads 20 are formed into a test contact configuration, such as that illustrated in FIG. 1 and FIG. 3. The test-only lead configuration does not facilitate connection to a substrate. For example, test-only leads extend only a short distance outside package body 26 and do not extend below the bottom of the package body. Therefore, connection of test-only leads to a substrate is not readily available using conventional device mounting methods. However, test-only leads can readily be contacted for test purposes. Test sockets may be designed which accommodate both test-only leads 20 and operational leads 18 so that device 10 can undergo full functional testing in one operation. Upon attaching device 10 to a user substrate (not illustrated), operational leads 18 are electrically coupled to conductors formed on the substrate. Test-only leads 20 remain uncoupled to the substrate, but are available for contact if failure analysis or device debugging is required since the outer portions of the test-only leads are external to package body 26. Once device 10 is mounted to the substrate, test-only leads 20 can be contacted using conventional test probes.

Typically, leads are shaped into an appropriate external configuration after a package body is provided and the device is excised from a leadframe. In device 10, package body 26 is a conventional molded plastic body formed, for example, of a thermosetting epoxy resin. Other package bodies are suitable for use with the present invention as well, including pre-formed ceramic and pre-formed plastic package bodies. Package body 26 is formed such that the outer portions of all leads extend along the periphery of the package body. Although device 10 includes leads on all four sides of package body 26, this is not a requirement of the present invention. After package body 26 is formed, device 10 is excised from leadframe 16 such that each lead is physically and electrical isolated from all others. The leads are then shaped into the appropriate configuration. Operational leads 18 are configured into a gull-wing configuration, whereas test-only leads 20 are shaped into a test contact configuration.

There are many ways in which to form two sets of leads having two different external lead configurations in accordance with the present invention. A few alternatives will be described in reference to device 10 of FIGS. 1-3. One method is to first shape operational leads 18 into the appropriate configuration and subsequently form test-only leads 20 into the appropriate configuration. As an alternative, both sets of leads may be shaped simultaneously. Typically, semiconductor device leads are shaped using a series of forming operations. For instance, in forming a gull-wing lead configuration in device 10, at least two forming operations are usually performed. As illustrated in FIG. 2, the first forming operation forms a first bend 28 in operational lead 18 near the periphery of package body 26 to direct the lead downward. A second forming operation forms a second bend 29 in the lead near the outermost tip of the lead to form a lead "foot" that is subsequently bonded to a user substrate. In accordance with the present invention, test-only leads may also be shaped using any combination of the forming operations used to form operational leads 18. Furthermore, test-only leads need not be shaped, as will become apparent in reference to FIG. 5.

One reason that using two different lead configurations, in accordance with the present invention, reduces the size of a semiconductor device is related to lead pitch limitations of the device. Lead pitch is the distance from a centerline of one lead to a centerline of an adjacent lead. One way to reduce the size of a device is to reduce lead pitch. However, as lead pitch is reduced, the difficulty in electrically coupling the leads to a substrate is increased. Many semiconductor device users couple devices to a substrate using solder. Solder pads are formed on the substrate and are brought into contact with solder-plated leads of a semiconductor device. Reflow techniques are used to form a metallurgical bond between the leads and the solder pads. If the solder pads on a user substrate are too close to one another, the solder pads may merge during the reflow process, thereby electrically short circuiting adjacent leads. A common practice to prevent short circuiting during solder reflow is to establish a minimum solder pad pitch on a user substrate. A typical minimum solder pad pitch is on the order of 0.5 mm.

While the solder pad pitch limitations facilitate device mounting on a substrate, the pitch limitations often prohibit reductions in size of a semiconductor device. Leads of a leadframe can often be made closer together than the minimum solder pad pitch. For instance, tape automated bonding (TAB) leads can be made with a lead pitch of 0.15 mm. However, the solder pad spacing limitations imposed by device users do not allow semiconductor manufacturers to reduce lead pitch below the solder pad pitch.

With the present invention, lead pitch of a semiconductor device can be made smaller than the solder pad pitch on a user substrate due to the fact that two different lead configurations are used. As illustrated in FIG. 1, and in accordance with a preferred embodiment of the present invention, test-only leads 20 are evenly distributed between operational leads 18. As a result, operational leads 18 have a lead pitch (from a centerline of one operational lead to a centerline of an adjacent operational lead) which will correspond to the solder pad spacing of a user substrate. However, the overall lead pitch of device 10 (from a centerline of any lead to a centerline of any adjacent lead) is much smaller, usually one-half the pitch of operational leads 18. The smaller overall lead pitch is possible because test-only leads need not be coupled to the user substrate. With respect to device 10, for example, operational leads 18 can have a lead pitch of 0.5 mm, whereas the pitch between an operational lead 18 and a test-only lead 20 can be 0.25 mm. Therefore, a device in accordance with the present invention having the same number of external leads as a conventional device is smaller because overall lead pitch is reduced and because the test-only leads are not coupled to a user substrate. In spite of a reduced lead pitch, a device in accordance with the present invention can be mounted to a user substrate as easily as a conventional device since the lead pitch of operational leads is designed to match the solder pad pitch on the substrate.

Figure 4:
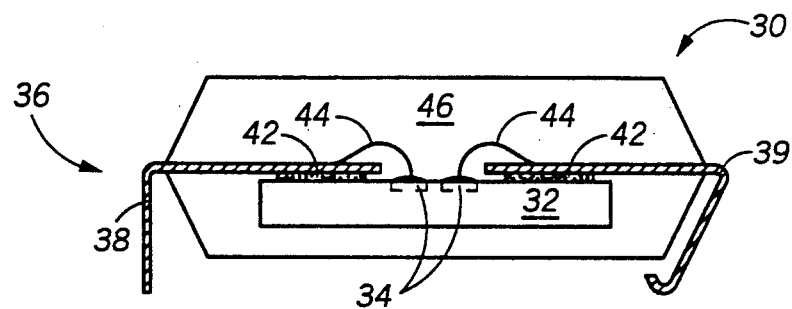
FIGS. 4 and 5 are cross-sectional views of two semiconductor devices also in accordance with the present invention, illustrating various lead configurations and ways in which leads can be bonded to a semiconductor die.
Figure 5:
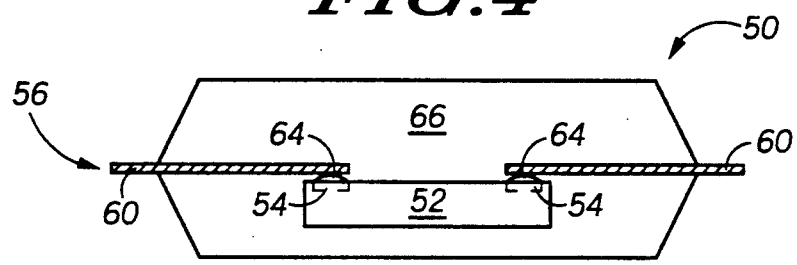

FIGS. 4-5 illustrate various lead configurations and methods for electrically coupling a semiconductor die to leads of a semiconductor device which can be implemented in the present invention. A semiconductor device 30 illustrated in FIG. 4 demonstrates a lead-on-chip (LOC) device in accordance with the present invention. A leadframe 36 of device 30 does not include a specific die support member. Instead, a semiconductor die 32 is attached to operational leads 38 and 39 of leadframe 36 by a double-sided adhesive tape 42. Operational leads 38 and 39 are electrically coupled to bond pads 34 of the die by conductive wires 44. Because many of the elements of device 30 are analogous to those of device 10 in FIGS. 1-3, the elements will not be described in detail. Device 30 also includes a package body 46 which encapsulates die 32, inner portions of operational leads 38 and 39, and conductive wires 44. Operational leads 38 and 39 extend outside package body 46 and are shaped into through-hole and J-lead lead configurations, respectively, and are suitable for attaching the device to a user substrate (not illustrated). Test-only leads of device 30 are not specifically illustrated, but in accordance with the present invention are configured differently than operation leads 38 and 39 to impede connection to the user substrate while allowing access for test purposes.

A semiconductor device 50, also in accordance with the present invention, is illustrated in a cross-sectional view in FIG. 5. A semiconductor die 52 is attached and electrically coupled to a tape automated bonding (TAB) leadframe 56. As in conventional TAB devices, the leadframe is coupled to die 52 by conductive bumps 64 which are formed on bond pads 54 of the die. In accordance with the present invention, test-only leads 60 extend outside a package body 66 into a test contact configuration. The test contact configuration enables electrical access to test portions of die 52; however, the test contact configuration is not well suited for attachment to a user substrate. Unlike the test-only lead configuration illustrated in FIG. 1, test-only leads 60 are not shaped outside of package 66. Instead, test-only leads 60 extend straight from the periphery of the package. A straight configuration facilitates top-side or bottom-side contact to the test-only leads using commercially available test equipment, yet at the same time does not enable the test-only leads to be mounted to a user substrate. Operational leads (not illustrated) of device 50 are electrically coupled to those portions of die 52 that need to be accessed for device operation, and are configured to facilitate connection of the operational leads to the user substrate.

Figure 6:
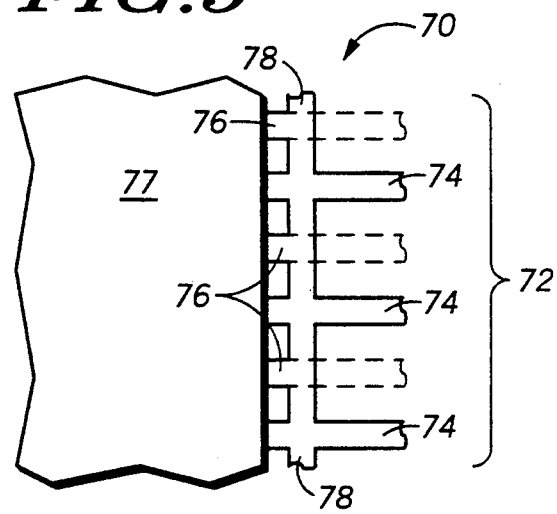
FIGS. 6 and 7 each illustrate a top view of a portion of a semiconductor device also in accordance with the present invention.
Figure 7:
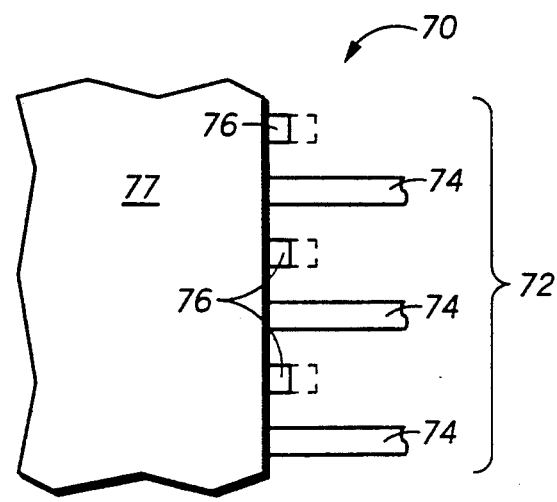

One suitable method for achieving test-only leads having a straight lead configuration is explained in reference to FIG. 6 and FIG. 7. Both figures illustrate a top view of a portion of a semiconductor device 70 during an intermediate stage of manufacturing. Device 70 includes a metal leadframe 72 having a plurality of operational leads 74, a plurality of test-only leads 76, and a dam bar 78. In accordance with a preferred embodiment of the invention, test-only leads 76 are evenly distributed between operational leads 74. Test-only leads 76 may terminate at dam bar 78 or may extend beyond the dam bar, as represented by the dashed lines in FIG. 6. Dam bar 78 physically joins the operational and test-only leads. Dam bars are well known in the art, and are used to confine a molding material to a specific area during the formation of a molded package body 77. More specifically, dam bar 78 prevents the molding material from extending beyond the package body between adjacent leads. Package body 77 encapsulates portions of leadframe 72 and a semiconductor die (not shown) which is electrically coupled to the operational and test-only leads. Although dam bar 78 is illustrated in FIG. 6 as being somewhat removed from package body 77 for purposes of clarity, in practice a dam bar is typically as close to the package body as possible in order to tightly control flow of the molding material.

After forming package body 77, dam bar 78 is removed, for example, by a conventional punching operation. Upon removing the dam bar, all leads become physically separated from one another, as illustrated in FIG. 7. Test-only leads 76 extend from package body 77 only a short distance, for instance on the order of 1.25 mm. Dam bar 78 may be removed such that test-only leads 76 terminate at a side of the dam bar which is closest to package body 77 or at a side which is farthest from package body 77, as indicated in FIG. 7 by the dashed lines. Test-only leads 76 as illustrated are straight and need not be shaped. A straight test-only lead configuration will provide adequate contact area for top-side or bottom-side testing. Operational leads 74, on the other hand, extend well beyond the package body and are subsequently shaped into a user mountable lead configuration.

In another embodiment of the present invention, operational leads 74 and test-only leads 76 may extend to a molded carrier ring (not illustrated) which physically supports outer portions of both set of leads after dam bar 78 is removed. Molded carrier rings are used to protect fragile leads from mechanical damage during test and various handling operations. After testing, the test-only leads may be cut from the ring to a desired final length. Cutting test-only leads 76 can be accomplished at the same time operational leads 74 are cut from the ring. The operational leads, and if desired the test-only leads, are shaped into the appropriate configuration after being excised from the carrier ring.

The foregoing description and illustrations contained herein demonstrate many of the advantages associated with the present invention. In particular, it has been revealed that a semiconductor device having test-only leads that are configured differently than operational leads enables the device to be made smaller than conventional devices in which the test leads and operational leads have the same configuration. In accordance with the present invention, operational leads have a configuration which is well suited for attachment to a user substrate. Test-only leads, however, are configured in such a way that connection of the test-only leads to a user substrate is more or less precluded. Use of two different lead configurations permits semiconductor device manufacturers to reduce lead pitch without increasing device mounting complexity. Therefore, device size can be reduced without adversely impacting the device user.

Thus, it is apparent that there has been provided, in accordance with the invention, a semiconductor device having test-only leads and method for making the same, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to having test-only leads evenly distributed among operational leads, as depicted in FIG. 1. The number of test-only leads and the number of operational leads will vary from device to device. Therefore, the specific number or position of test-only leads is not limited by the present invention. It is also important to note that in accordance with the present invention both test portions and operational portions of an integrated circuit may be used for device testing; however, test portions cannot be accessed during normal device operation due to the configuration of test-only leads. Therefore, test portions of the integrated circuit are excluded from operational portions. In addition, the invention is not limited to any specific package type. While the present invention is applicable to plastic leaded chip carriers (PLCCs), dual-in-line packages (DIPs), quad-flat-packs (QFPs), small-outline J-lead (SOJs), and thin-small-outline packages (TSOPs), it is envisioned that other package types will benefit from the present invention. Due to the rapid changes in semiconductor manufacturing technology, it is also envisioned that new materials and new manufacturing techniques will allow for many improvements to the present invention. Therefore, it is important to note that the present invention is not limited in any way to those materials specifically described. Nor is the invention limited to those manufacturing processes herein mentioned. Furthermore, since semiconductor devices continue to become smaller and smaller, the dimensions listed are merely representative and in no way restrict the invention. It is, therefore, intended that this invention encompass all such variations and modifications as fall within the scope of the appended claims.

We claim:

1. A semiconductor device comprising:
    a semiconductor die having an integrated circuit formed thereon, a first plurality of bond pads electrically coupled to operational portions of the integrated circuit, and a second plurality of bond pads electrically coupled to test portions of the integrated circuit;
    a first plurality of conductive leads electrically coupled to the first plurality of bond pads, each lead of the first plurality of leads being configured for connection to a user substrate; and
    a second plurality of conductive leads electrically coupled to the second plurality of bond pads, each lead of the second plurality of leads being configured for testing of the device and being configured such that connection to the user substrate is impeded, and wherein the second plurality of leads is singularly interdigitated among the first plurality of leads.

2. The semiconductor device of claim 1 wherein each lead of the first plurality of leads has a configuration selected from a group consisting of: J-lead, gull-wing, through-hole, and butt-joint.

3. The semiconductor device of claim 1 further comprising a package body having a bottom surface and a perimeter, the package body encapsulating the semiconductor die and portions of the first and second pluralities of leads, wherein each lead of the first plurality of leads extends from the perimeter of the package body to a point below the bottom of the package body and body and wherein each lead of the second plurality of leads extends from the perimeter of the package body to a point above the bottom of the package.

4. The semiconductor device of claim 3 wherein the package body is a molded package body.

5. The semiconductor device of claim 1 wherein the second plurality of conductive leads is evenly distributed between the first plurality of conductive leads.

6. A semiconductor device comprising:
    a semiconductor die having an integrated circuit formed thereon, a first plurality of bond pads electrically coupled to operational portions of the integrated circuit, and a second plurality of bond pads electrically coupled to test portions of the integrated circuit;
    a leadframe having a first plurality and a second plurality of conductive leads, each lead of the first and second pluralities of leads having an inner portion and an outer portion and wherein the second plurality of leads is singularly interdigitated among the first plurality of leads;

means for electrically coupling the inner portions of the first plurality of leads to the first plurality of bond pads of the semiconductor die;

means for electrically coupling the inner portions of the second plurality of leads to the second plurality of bond pads of the semiconductor die; and a package body which encapsulates the semiconductor die and inner portions of the first and second pluralities of leads, the package body having a bottom surface and a perimeter;

wherein the outer portions of the first and second pluralities of leads extend from the perimeter of the package body, and wherein the outer portions of the first plurality of leads are configured differently than the outer portions of the second plurality of leads.

7. The semiconductor device of claim 6 wherein the outer portion of each lead of the second plurality of leads is configured into a test contact.

8. The semiconductor device of claim 7 wherein the outer portion of each lead of the second plurality of leads is configured to conform to the package body and terminates above the bottom of the package body.

9. The semiconductor device of claim 7 wherein the outer portion of each lead of the second plurality of leads is straight and terminates above the bottom of the package body.

10. The semiconductor device of claim 7 wherein the outer portion of each lead of the first plurality of leads has a configuration selected from a group consisting of: J-lead, gull-wing, through-hole, and butt-joint.

11. The semiconductor device of claim 6 wherein the test portions of the integrated circuit are excluded from the operational portions of the integrated circuit.

12. A semiconductor device comprising:
a semiconductor die having an integrated circuit formed thereon, a plurality of operational bond pads electrically coupled to operational portions of the integrated circuit, and at least one test-only bond pad electrically coupled to a test portion of the integrated circuit;

a plurality of operational leads electrically coupled to the plurality of operational bond pads, each lead of the plurality of operational leads being configured for connection to a user substrate, wherein the plurality of operational leads are arranged to have a first pitch; and at least one test-only lead electrically coupled to the at least one test-only bond pad, the at least one test-only lead being configured for testing the device and being configured such that connection to the user substrate is impeded, wherein the at least one test-only lead is arranged between two adjacent operational leads and has a second pitch with respect to the two adjacent operational leads which is less than the first pitch.

13. The semiconductor device of claim 12 wherein each lead of the plurality of operational leads has a configuration selected from a group consisting of: J-lead, gull-wing, through-hole, and butt-joint.

14. The semiconductor device of claim 12 wherein the second pitch is approximately one-half the first pitch.

15. The semiconductor device of claim 12 further comprising a package body having a bottom surface and a perimeter, the package body encapsulating the semiconductor die and portions of the plurality of operational leads and the at least one test-only lead, wherein each lead of the plurality of operational leads extends from the perimeter of the package body to a point below the bottom of the package body and wherein the at least one test-only lead of extends from the perimeter of the package body to a point above the bottom of the package.

16. The semiconductor device of claim 15 wherein the package body is a molded package body.

17. The semiconductor device of claim 16 wherein the second pitch is approximately one-half the first pitch.

* * * * *

UNITED STATES PATENT AND TRADEMARK OFFICE
CERTIFICATE OF CORRECTION

PATENT NO. : 5,250,841

DATED : October 5, 1993

INVENTOR(S) : James W. Sloan et al.

It is certified that error appears in the above-identified patent and that said Letters Patent is hereby corrected as shown below:

Claim 3, column 8, line 47; after "package body", delete "and body".

Signed and Sealed this

Seventh Day of June, 1994

Attest:

BRUCE LEHMAN

Attesting Officer   Commissioner of Patents and Trademarks